United States Patent
Brodsky et al.

(10) Patent No.: US 7,849,592 B2
(45) Date of Patent: Dec. 14, 2010

(54) METHOD OF COMPENSATING FOR THERMAL EXPANSION IN SMT INTERCONNECTS

(75) Inventors: William Louis Brodsky, Binghamton, NY (US); Amanda Elisa Mikhail, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 50 days.

(21) Appl. No.: 12/357,836

(22) Filed: Jan. 22, 2009

(65) Prior Publication Data

US 2010/0184305 A1  Jul. 22, 2010

(51) Int. Cl.
*H01R 43/00* (2006.01)
(52) U.S. Cl. .............. 29/832; 29/825; 29/840
(58) Field of Classification Search ........ 29/825, 29/832, 840
See application file for complete search history.

(56) References Cited

U.S. PATENT DOCUMENTS

| | | | |
|---|---|---|---|
| 5,610,436 A * | 3/1997 | Sponaugle et al. | 257/669 |
| 6,764,325 B2 * | 7/2004 | Arrigotti et al. | 439/161 |
| 7,056,133 B2 * | 6/2006 | Iwasaki | 439/83 |
| 2003/0216066 A1 | 11/2003 | Arrigotti et al. | |
| 2008/0141530 A1 | 6/2008 | Beaman et al. | |
| 2008/0180900 A1 * | 7/2008 | Domitrovits et al. | 361/684 |

* cited by examiner

*Primary Examiner*—C. J Arbes
(74) *Attorney, Agent, or Firm*—The Law Firm of Andrea Hence Evans, LLC

(57) ABSTRACT

The present invention relates to a method of providing end and center locating connectors in interconnects between surface mount technology (SMT) connectors and printed circuit boards (PCBs). The connectors are adapted to maintain their connection even when the printed circuit board and/or the SMT connector expands or contracts.

1 Claim, 1 Drawing Sheet

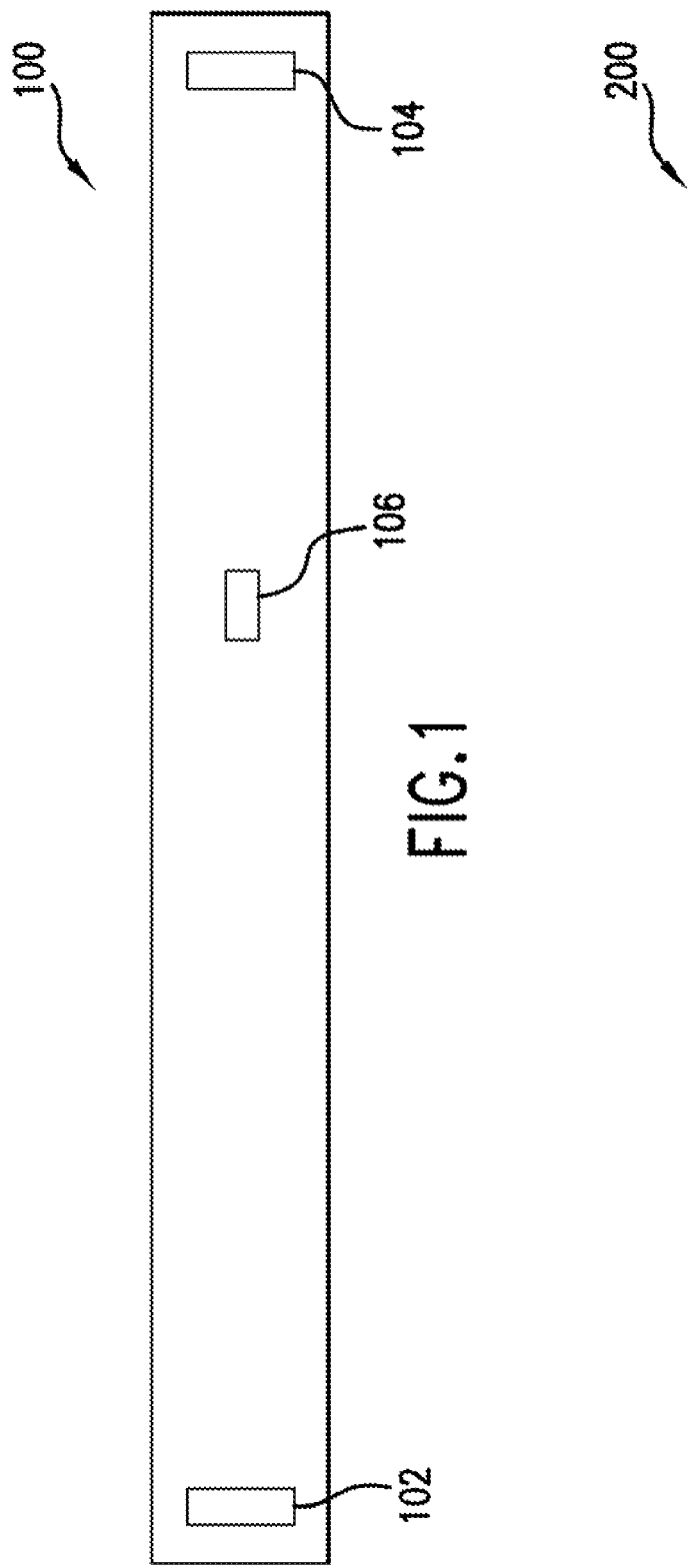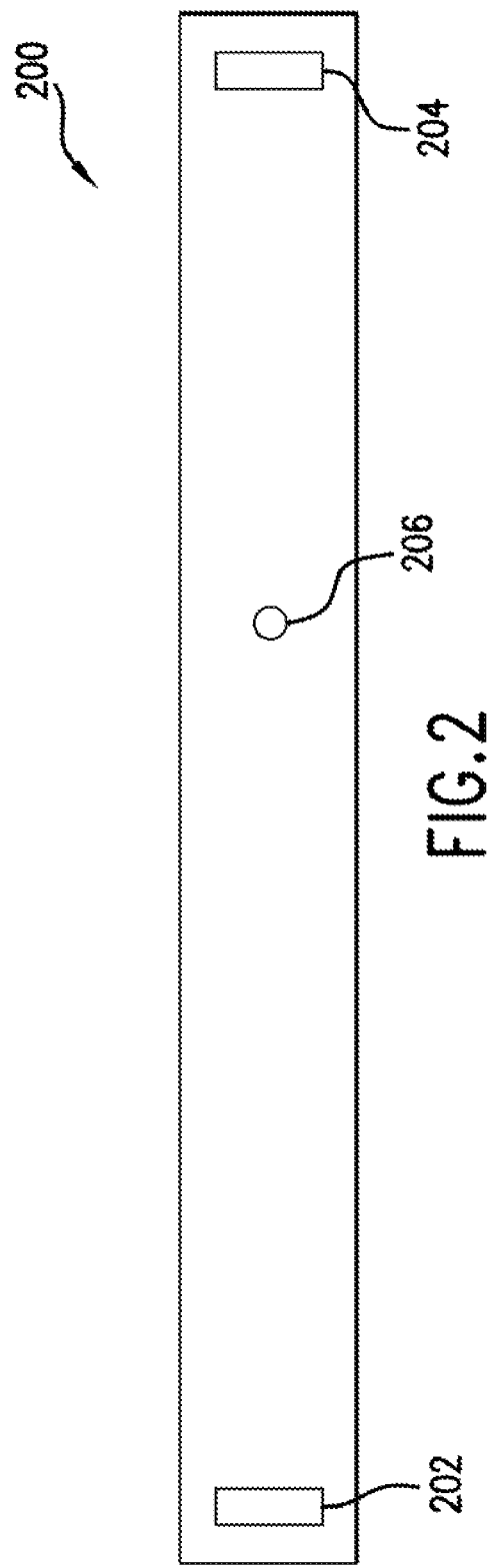

METHOD OF COMPENSATING FOR THERMAL EXPANSION IN SMT INTERCONNECTS

CROSS REFERENCE TO RELATED APPLICATIONS

There are no cross-references related to this application.

FIELD OF THE INVENTION

This invention relates to thermal mismatch between connector housings and the printed circuit boards they are mounted on and specifically, compensating for thermal mismatch in surface mount technology (SMT) connectors and printed Circuit boards.

BACKGROUND OF THE INVENTION

More of the electronic packaging industry applications are utilizing SMT connectors to improve printed circuit board (PCB) wiring density, impedance matching, and path length concerns. New mechanical requirements emerge from the SMT connector technology due to assembly of these delicate SMT interface with relatively tight tolerances, compared to the previous and more mechanically robust compliant pin or pin-through-hole interface technologies utilized in previous applications.

SUMMARY OF THE INVENTION

The present invention provides a method of compensating for thermal expansion of SMT interconnects. The present invention involves determining a clearance length on a printed circuit board and providing both a first locating feature and a second locating feature at the respective ends of the clearance length. The locating features are each adapted to receive one or more end connectors of an SMT connector such as a Dual Inline Memory Module (DIMM) connector. The locating features are also adapted to maintain connection with the one or more SMT end connectors when either the SMT connector or the printed circuit board thermally expands or contracts. The present invention also involves providing one or more center features at a location within said clearance length on the printed circuit board. The one or more center features is adapted to maintain connection with one or more center locating pins of the SMT connector when the SMT connector or the printed circuit board thermally expands or contracts. The center locating pin may be tapered. The present invention also involves engaging the printed circuit board with the SMT connector by the one or more center locating pin where the SMT end connectors are flexible and allow flexure in the length-wise direction of the SMT connector.

BRIEF DESCRIPTION OF THE DRAWINGS

The features and advantages of aspects of the present invention, will become more apparent from the detailed description set forth below when taken in conjunction with the claims and drawings, in which like reference numbers indicate identical or functionally similar elements or steps. Additionally, the left-most digit of a reference number identifies the drawing in which the reference number first appears.

FIG. 1 illustrates a printed circuit board (PCB) in accordance with an aspect of an embodiment of the present, invention.

FIG. 2 illustrates a printed circuit board (PCB) in accordance with another aspect, of an embodiment of the present invention.

DETAILED DESCRIPTION OF THE INVENTION

The present invention compensates for the expansion and contraction of monolithic SMT interconnect along the long axis of the SMT connector. End guidance is critical to the proper attachment of these types of SMT connectors with PCBs, and this invention proposes flexible attach points at the ends of the connectors to allow for expansion of the connector.

In an aspect of an embodiment of the present invention, an SMT connector such as a DIMM, connector may have a center locating pin which is longer (in the direction of board assembly) than the rest of the other SMT connector leads which may engage the PCB before the other SMT connections. In an aspect of an embodiment of the present invention, the center locating pin may act as a datum for determining the coefficient of thermal expansion (CTE) mismatch between the SMT connector and the PCB. In another aspect of an embodiment of the present invention, the center locating pin may have a tapered shape. In yet another aspect of an embodiment of the present invention, the center locating pin may have a forked or blade-shaped design in order to limit rotation of the SMT connector about the center. This reduces the potential of solder smear during the reflow process. In yet another aspect of an embodiment of the present invention, the SMT end connectors may be flexible board locks located at the end locations that allow expansion/contraction m the "length" direction of the SMT connector. In a further aspect of an embodiment of the present, invention, the SMT end connectors may be flexible blade (leaf-spring) board locks with small enough k-value for spring stiffness) to allow connector ends to easily move with expansion/contraction of the SMT connector, but little movement in the direction orthogonal to the length of the SMT connector.

In another aspect of an embodiment of the present invention, the center locating pin may be longer than the rest of the alignment features and SMT or SMT leads for early engagement with the PCB. The center locating pin may act as a datum for the SMT connector as a zero-point for the resulting elongation/contraction due to the coefficient of thermal expansion (CTE) mismatch differences between the connector and the PCB. In one aspect of an embodiment of the present invention, the center locating pin may have be a tapered locating pin. In an aspect of an embodiment of the present invention, the center locating pin may be long enough for proper engagement and location prior to the first and second end locating features or connectors and SMT leads contacting either the PCS and/or solder. In yet another aspect of an embodiment of the present invention, the center locating pin may have a forked or blade-shaped design which limits rotation of the connector about center, further reducing the potential of solder smear. In yet another aspect of an embodiment of the present invention, the PCB may have board lock clearance holes or features which allow for expansion/contraction along the length of the SMT connector. In yet another aspect of an embodiment of the present invention, the connector may have board locks with less interference in the direction of the length of the connector, but with sufficient interference in the direction orthogonal to the length of the connector to limit translation/rotation of the connector. It should be noted that, the term 'center locating pin' indicates a locating feature not at the end of the connector and intended to minimize the overall, length effects of the connector during assembly processes. It does not have to be physically located at the center of the connector and may be off-set from center for purposes of keying.

In yet a further aspect of an embodiment of the present invention, the center locating pin may be round, flat, cruciform, diamond, square, or other shape to provide contact or registration and alignment of the connector to PCB in lengthwise direction of the connector. In yet a further aspect of the present invention, the first and second secondary or end connectors may be oval, diamond, flat blades, rectangular in shape, etc to allow clearance in the lengthwise direction of the connector but provide alignment in an axis perpendicular to the connectors long axis but parallel to the PCB surface. They may also be flexible in the long axis of connector to accommodate dimensional mismatch of the PCB-to-connector housing through temperature excursion and cool-down. In another aspect of an embodiment of the present invention, the end connectors may allow flexure in the length-wise direction of the SMT connector. In yet a further aspect of an embodiment of the present invention, the locating features may have an interference fit to PCB hole interior to provide a friction retention force after positioning on PCB surface. In another aspect of an embodiment of the present invention, the locating features may be a slip fit to PCB locating holes to reduce assembly process forces or be either an interference or slip fit based on location on connector body. In another aspect of the present invention, the end and center locating pins are adapted to maintain contact with the PCB when the SMT connector and/or the PCB thermally expands or contracts.

Referring now to FIG. 1, a printed circuit board (PCB) 100 in accordance with an embodiment of the present invention, is shown. Here, the PCB is shown with two end sockets or features 102 and 104. Respective features on the connector and PCB 100 at end locating features 102 and 104 are separated from each other by a clearance length to enable thermal, expansion differences between the printed circuit board PCB 100 and connector. PCB 100 also shows a center locating feature 106 and end locating features 102 and 104.

In one aspect of an embodiment of the present invention, the clearance length may be approximated by the following formula:

Clearance length=$(CTE_{Body1}-CTE_{Body2})\times$(distance between alignment features)$\times$change in temperature where, CTE is the coefficient of thermal expansion for each identified body and where the distance between alignment features would be measured from feature 106 to 102 or 106 to 104.

Referring now to FIG. 2 a printed circuit board (PCB) 200 in accordance with an embodiment of the present invention, is shown. Here, PCB is shown with a first and second end sockets or features 202 and 204 while a center locating feature 206 is shown somewhere in the distance between the two end features. Center locating feature 206 maybe adapted to receive a board lock for in-process retention.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims. The invention has been described in detail with particular reference to certain preferred embodiments or aspects of embodiments thereof, but it will be understood that variations and modifications can be effected within the spirit and scope of the invention.

The invention claimed is:

1. A method of compensating for thermal expansion of SMT interconnects comprising:
   determining a clearance length on a printed circuit board;
   providing a first locating feature and a second locating feature at the respective ends of said clearance length, wherein said locating features are such that each receives at least one end connector of a SMT connector and wherein said locating features maintain connection with said at least one end connector of said SMT connector when said SMT connector or said printed circuit board thermally expands or contracts;
   providing at least one center feature at a location within said clearance length on said printed circuit board wherein said at least one center feature maintain connection with at least one center locating pin of said SMT connector when said SMT connector or said printed circuit hoard thermally expands or contracts, wherein said center locating pin is tapered; and
   engaging said printed circuit board with said SMT connector by said at least one center locating pin wherein said SMT end connectors are flexible and allow expansion/contraction in the length-wise direction of said SMT connector.

* * * * *